United States Patent [19]
Zocher

[11] Patent Number: 5,673,003
[45] Date of Patent: Sep. 30, 1997

[54] AMPLIFIER CIRCUIT HAVING A VARIABLE BANDWIDTH

[75] Inventor: Andrew Gerald Zocher, Algonquin, Ill.

[73] Assignee: Motorola, Inc., Schaumburg, Ill.

[21] Appl. No.: 625,658

[22] Filed: Mar. 29, 1996

[51] Int. Cl.[6] .............................. H03F 3/191; H04B 1/02
[52] U.S. Cl. ...................... 330/305; 330/252; 330/303; 330/306; 327/555; 455/93; 455/120; 455/266
[58] Field of Search ........................... 330/51, 252, 303, 330/305, 306, 307; 327/553, 555, 558; 455/93, 95, 120, 125, 266, 307, 340

[56] References Cited

U.S. PATENT DOCUMENTS

| | | |
|---|---|---|
| 4,288,754 | 9/1981 | Okada et al. . |
| 4,306,198 | 12/1981 | Okada . |
| 4,713,627 | 12/1987 | Addis . |
| 4,724,407 | 2/1988 | Miura et al. . |
| 4,748,422 | 5/1988 | Matsumoto et al. . |
| 4,888,502 | 12/1989 | Jarrett . |
| 5,266,852 | 11/1993 | Shingenari et al. . |
| 5,293,087 | 3/1994 | Hamano et al. . |
| 5,311,143 | 5/1994 | Soliday . |
| 5,604,927 | 2/1997 | Moore ......................... 455/266 |

*Primary Examiner*—James B. Mullins
*Attorney, Agent, or Firm*—John J. Oskorep

[57] ABSTRACT

An amplifier circuit (204) having a variable bandwidth comprises an amplifier (300), a capacitive element (304), a first npn transistor (302), and a switch control circuit (306). The first npn transistor (302) has a base coupled to an output terminal (205) of the amplifier (300), a collector coupled to a first reference voltage (113), and an emitter coupled to the capacitive element (304) and the switch control circuit (306). When the first npn transistor (302) is switched off by the switch control circuit (306), a first cutoff frequency is determined by a maximum operating frequency of the amplifier (300). When the first npn transistor (302) is switched on by the switch control circuit (306), a second cutoff frequency is determined by a capacitance of the capacitive element (304). For high frequency operation, the amplifier (300) includes at least a second npn transistor for amplification and the first cutoff frequency is determined by a Miller capacitance of the amplifier circuit (204).

12 Claims, 5 Drawing Sheets

AMPLIFIER CIRCUIT HAVING A VARIABLE BANDWIDTH

FIELD OF THE INVENTION

The present invention relates generally to amplifiers, and more particularly to high frequency amplifiers which provide variable bandwidths.

BACKGROUND OF THE INVENTION

Analog signal processing in an integrated circuit (IC) often involves the use of an amplifier. An amplifier may be used in an IC for various reasons, such as for increasing or decreasing the voltage level of a signal. While operating, non-idealities of the amplifier tend to introduce spurious output signals, such as signal harmonics, which may affect further processing of the signal.

One goal in designing an amplifier has been to provide low-pass filtering for such spurious output signals. A simple way to provide such low-pass filtering is to use a low-pass resistor-capacitor (RC) filter. Here, however, an IC's flexibility is reduced because an operating bandwidth of the amplifier may need to change with various system applications. Complex filtering methods have also been used, but these methods are unfeasible as an operating frequency of the amplifier approaches a transition frequency of active devices of the amplifier. In addition, many conventional designs which vary the amplifier's operating bandwidth do so by changing a bias current of the amplifier, thereby undesirably changing an amplifier's low frequency gain and intermodulation characteristics. Other conventional designs utilize n-channel metal-oxide semiconductor (NMOS) transistors in the signal path, thereby reducing a maximum operating frequency of the amplifier. Circuit complexity, cost, and minimum operating voltage requirements are other important considerations when designing an amplifier.

Accordingly, there is a need for a simple amplifier circuit capable of operating at relatively high frequencies and having a variable frequency bandwidth for use in various system applications.

DETAILED DESCRIPTION OF THE PREFERRED EMBODIMENTS

According to the present invention, an amplifier circuit has a variable frequency response including a first cutoff frequency and a second cutoff frequency. The amplifier circuit comprises an amplifier, a capacitive element, a npn transistor, and a switch control circuit. The npn transistor has a base coupled to an output of the amplifier, a collector coupled to a first reference voltage, and an emitter coupled to a first end of the capacitive element and the switch control circuit, the capacitive element and the switch control circuit each having second ends coupled to a second reference voltage. When the npn transistor is switched off by the switch control circuit, the first cutoff frequency is determined by a maximum operating frequency of the amplifier. When the npn transistor is switched on by the switch control circuit, the second cutoff frequency is determined by a capacitance of the capacitive element. For high frequency operation, the amplifier includes only npn transistors for amplification and the first cutoff frequency is determined by a Miller capacitance of the amplifier circuit.

Figure 1:
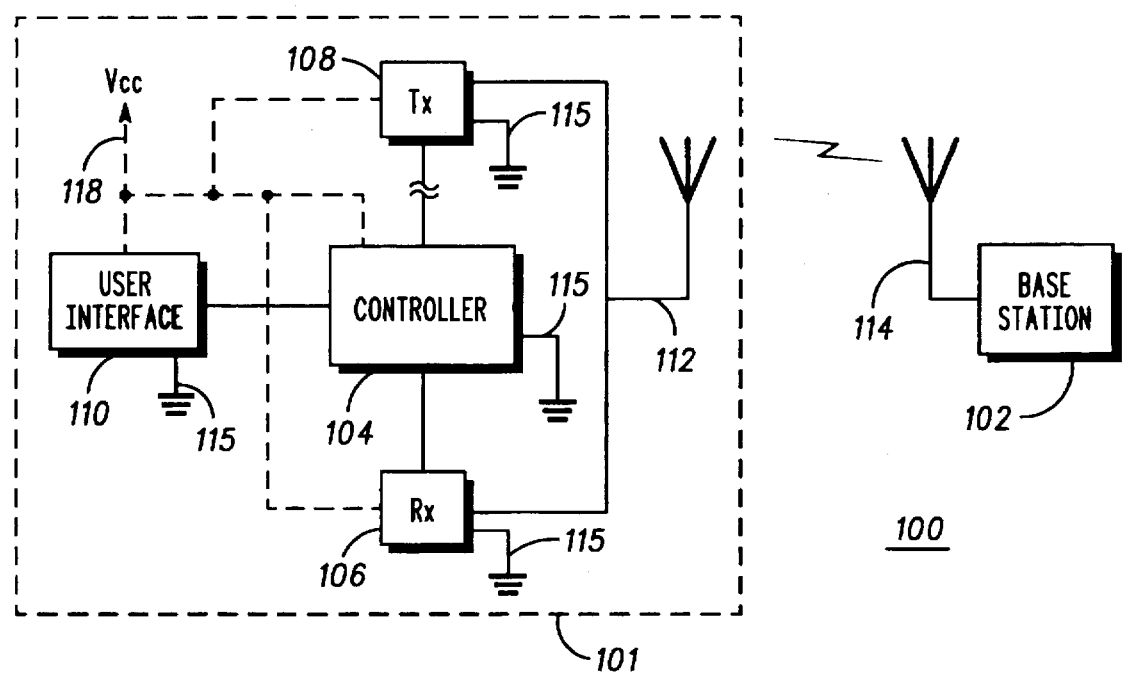
FIG. 1 is a block diagram of a communication system.

FIG. 1 is a block diagram of a communication system 100 which may embody the present invention. Communication system 100 may be, for example, a cellular telephone system. Communication system 100 comprises a mobile station 101 and a base station 102. Mobile station 101, a communication device, includes a controller 104, a receiver 106, a transmitter 108, a user interface 110, and an antenna 112. Controller 104, receiver 106, transmitter 108, and user interface 110 are each voltage-biased at a reference voltage 113, preferably a supply voltage, Vcc, and a reference voltage 115, preferably ground. Base station 102, another communication device, sends and receives radio frequency (RF) signals to and from mobile station 101 through an antenna 114. Mobile station 101 receives the RF signals through antenna 112 and receiver 106. Controller 104 assists in controlling mobile station 101 based on the RF signals and input signals from user interface 110. Data signals are generated from controller 104 and from input signals to user interface 110. The data signals are modulated by transmitter 108 and the resultant RF signals are transmitted through antenna 112. In the preferred embodiment, communication system 100 provides a dual-mode system operation where the RF signals are modulated in either an analog or digital fashion.

Figure 2:
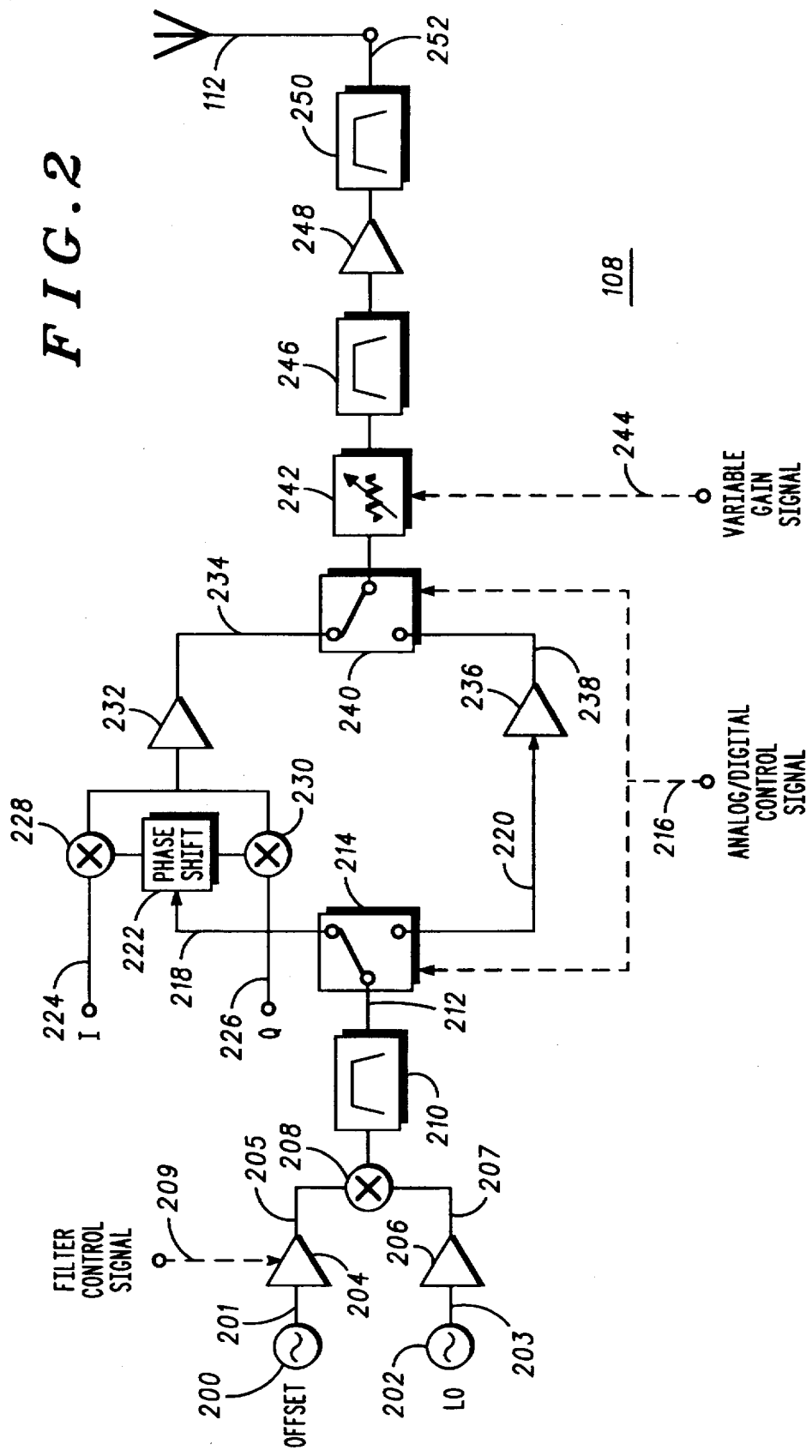
FIG. 2 is a block diagram of a portion of a transmitter of a mobile station which may embody the present invention.

FIG. 2 is a block diagram of a portion of transmitter 108. In this embodiment, transmitter 108 is a dual-mode transmitter having an operating mode which is either analog or digital. Transmitter 108 comprises an offset frequency generator 200, a local oscillator generator 202, an amplifier circuit 204, an amplifier 206, a mixer 208, a filter 210, a switch 214, a phase shifter 222, a mixer 228, a mixer 230, an amplifier 232, an amplifier 236, a switch 240, a variable gain stage 242, a filter 246, a power amplifier 248, and a filter 250. Offset frequency generator 200 generates a signal which is input to amplifier circuit 204 at an input terminal 201, and local oscillator generator 202 generates a signal which is input to amplifier 206 at input terminal 203. Since non-idealities of amplifier circuit 204 may introduce spurious output signals during operation, amplifier circuit 204 includes special filtering. Output signals at output terminals 205, 207 are generated by amplifier circuit 204 and amplifier 206, respectively, and are mixed through mixer 208. Mixer 208 generates a signal which is subsequently filtered by filter 210. A carrier signal at an output 212 of filter 210 is routed for either analog or digital processing depending on the operating mode selected (shown by a position of switch 214). Switch 214 is controlled by an analog/digital control signal 216 from controller 104.

When the operating mode is digital, output 212 is coupled to input 218 of phase shifter 222. An I signal 224 ("in-phase" signal) and a Q signal 226 ("quadrature-phase" signal) comprise digital data signals used for digital modulation. I signal 224 is input to mixer 228 and Q signal 226 is input to mixer 230. The carrier signal is processed by phase shifter 222 and mixed with I and Q signals 224, 226. The resultant mixed signal is amplified by amplifier 232, generating an output signal at output 234. The output signal is fed into switch 240, which is also controlled by analog/digital control signal 216. Assuming the operating mode is digital, switch 240 will couple output 234 to variable gain stage 242.

When the operating mode is analog, output 212 is coupled to input 220 by switch 214. The carrier signal is amplified by amplifier 236, generating an output signal at output 238 which is fed into switch 240. Assuming the operating mode is analog, switch 240 will couple output 238 to variable gain stage 242. Variable gain stage 242 is controlled by a variable gain control signal 244 from controller 104. The resultant signal is processed by filter 246, power amplifier 248, and filter 250. The output of filter 250 is coupled to antenna 112, whereby the signal is transmitted.

Figure 3:
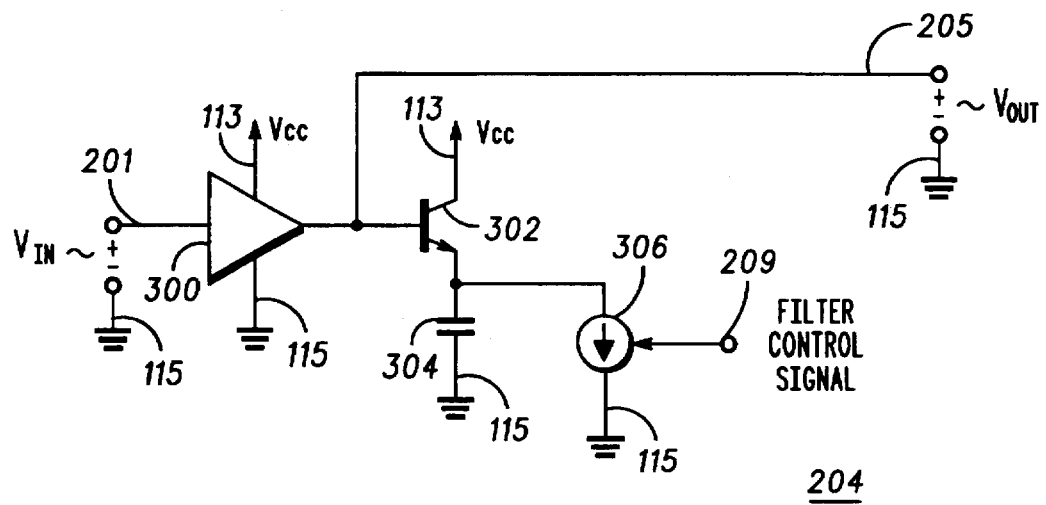
FIG. 3 is a schematic diagram of an amplifier circuit in accordance with the present invention.

FIG. 3 shows a schematic diagram of amplifier circuit 204 in accordance with the present invention. Amplifier circuit 204 comprises an amplifier 300, an npn transistor 302, a capacitive element 304, and a switch control circuit 306. Amplifier 300 is biased at reference voltage 113 and reference voltage 115, and includes input terminal 201 wherein the input signal is applied. Npn transistor 302 has a base coupled to output terminal 205, a collector coupled to reference voltage 113, and an emitter coupled to a first end of capacitive element 304. Capacitive element 304 has a second end coupled to reference voltage 115. The emitter of npn transistor 302 is also coupled to a first end of switch control circuit 306. Switch control circuit 306 has a second end coupled to reference voltage 115. Current flow of switch control circuit 306 is controlled by filter control signal 209.

Figure 6:
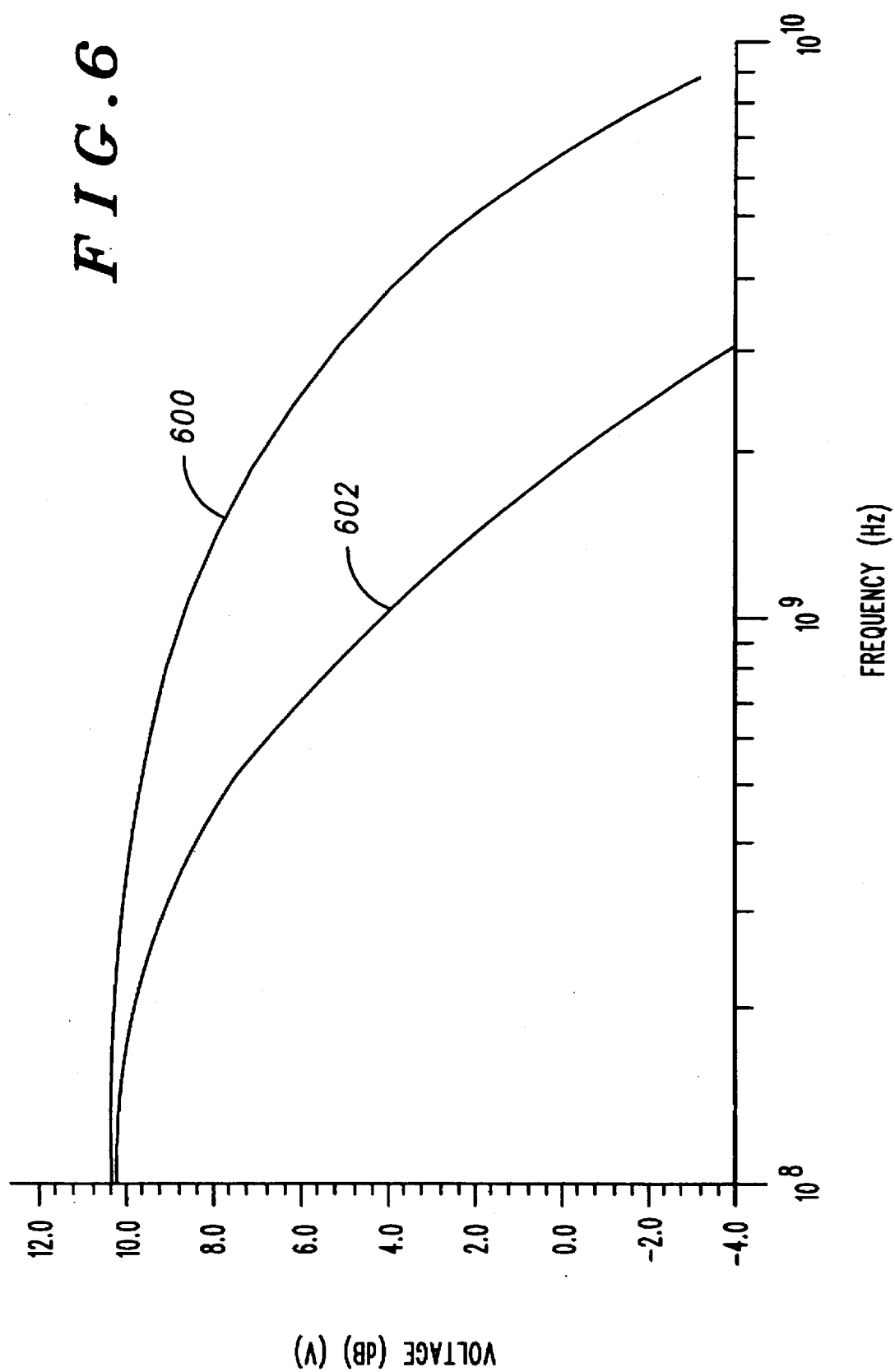
FIG. 6 is a graph showing a variable frequency response of an amplifier circuit designed in accordance with the present invention.

Amplifier circuit 204 has a variable frequency response, including a first frequency response having a first cutoff frequency and a second frequency response having a second cutoff frequency. (An example of such a variable frequency response is shown in FIG. 6, which will be discussed later.) Filter control signal 209 turns on and off npn transistor 302 through switch control circuit 306. The first cutoff frequency is established when filter control signal 209 signals switch control circuit 306 to inhibit current flow. Here, npn transistor 302 is not conducting and therefore capacitive element 304 is not effectively coupled between output terminal 205 and reference voltage 115. The second cutoff frequency is established when filter control signal 209 signals switch control circuit 306 to enable current flow. Here, npn transistor 302 is conducting and therefore capacitive element 304 is effectively coupled between output terminal 205 and reference voltage 115. For high-frequency operation, amplifier 300 includes only npn transistors for amplification where the first cutoff frequency is substantially determined by a Miller capacitance of amplifier circuit 204. The Miller capacitance, discussed in detail below, is a function of a gain of amplifier 300 and base-to-collector capacitances of the npn transistors of amplifier 300.

In the preferred embodiment, amplifier circuit 204 is manufactured in an integrated circuit (IC), providing flexibility for various system applications.

Figure 4:
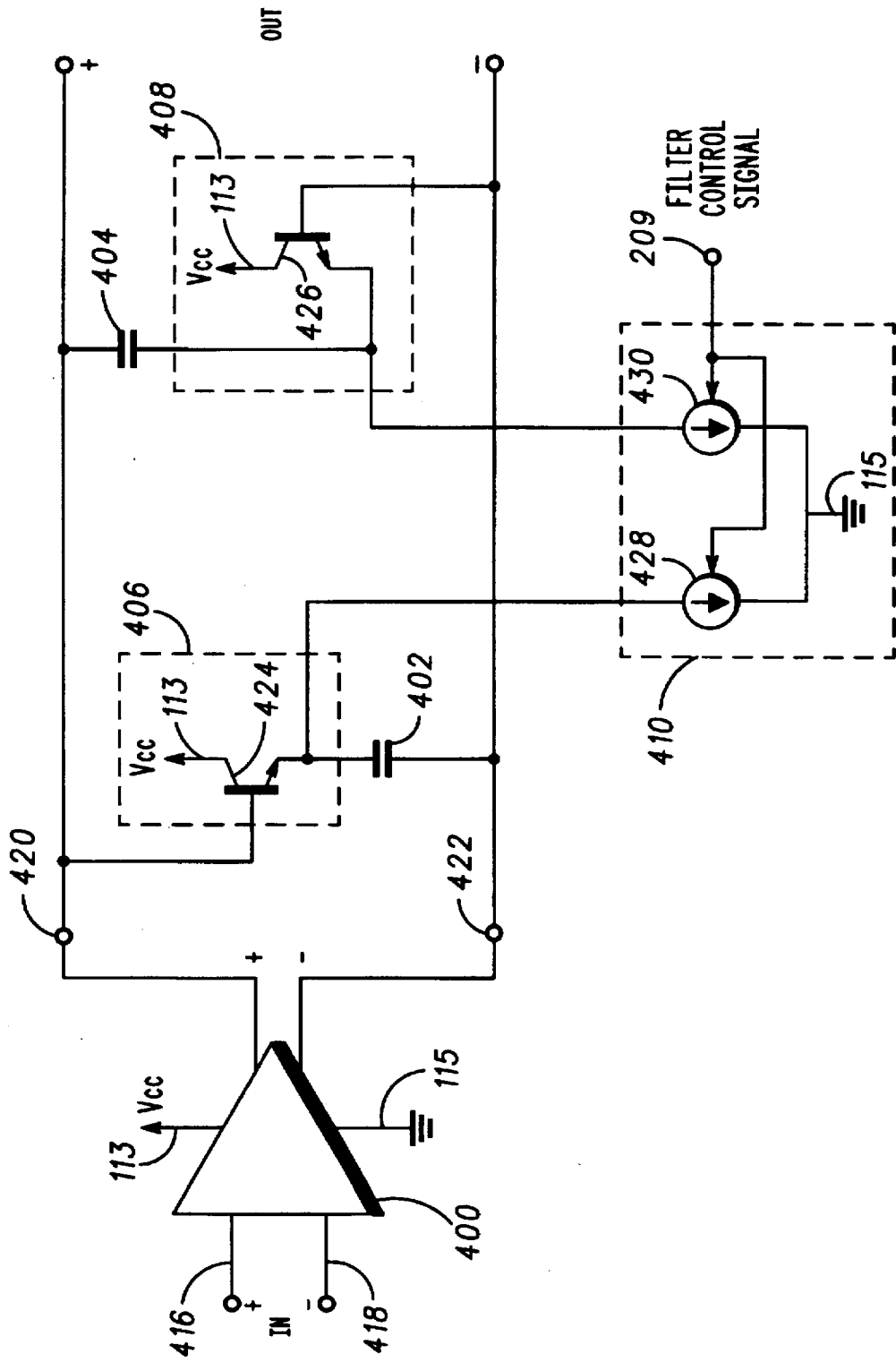
FIG. 4 is a schematic diagram of an amplifier circuit in accordance with the present invention.

FIG. 4 shows a schematic diagram of amplifier circuit 204 in accordance with the present invention. Amplifier circuit 204 comprises a differential amplifier 400, a capacitive element 402, a capacitive element 404, a switch 406, a switch 408, and a switch control circuit 410. Differential amplifier 400 is voltage-biased at reference voltage 113 and reference voltage 115. Differential amplifier 400 has input terminals 416, 418 wherein the input signal is applied, and output terminals 420, 422 wherein the output signal is taken. Switch 406 includes an npn transistor 424 having a base coupled to output terminal 420, a collector coupled to reference voltage 113, and an emitter coupled to a first end of capacitive element 402. Capacitive element 402 has a second end coupled to output terminal 422. Switch 408 includes an npn transistor 426 having a base coupled to output terminal 422, a collector coupled to reference voltage 113, and an emitter coupled to a first end of capacitive element 404. Capacitive element 404 has a second end coupled to output terminal 420. Switch control circuit 410 comprises a controllable current source 428 and a controllable current source 430. Controllable current source 428 has a first end coupled to the emitter of npn transistor 424 and a second end coupled to reference voltage 115. Controllable current source 430 has a first end coupled to the emitter of npn transistor 426 and a second end coupled to reference voltage 115.

Controllable current sources 428, 430 are coupled and responsive to filter control signal 209. To establish a first cutoff frequency, filter control signal 209 controls controllable current sources 428, 430 to inhibit current flow. Here, npn transistors 424, 426 are switched off and the first cutoff frequency is determined by a maximum operating frequency of differential amplifier 400. The maximum operating frequency is determined substantially by a Miller capacitance of differential amplifier 400, where differential amplifier 400 includes only npn transistors for amplification. To establish a second cutoff frequency, filter control signal 209 controls controllable current sources 428, 430 to allow current flow. Here, npn transistors 424, 426 are switched on and the second cutoff frequency is determined substantially by capacitances of capacitive elements 402, 404.

Figure 5:
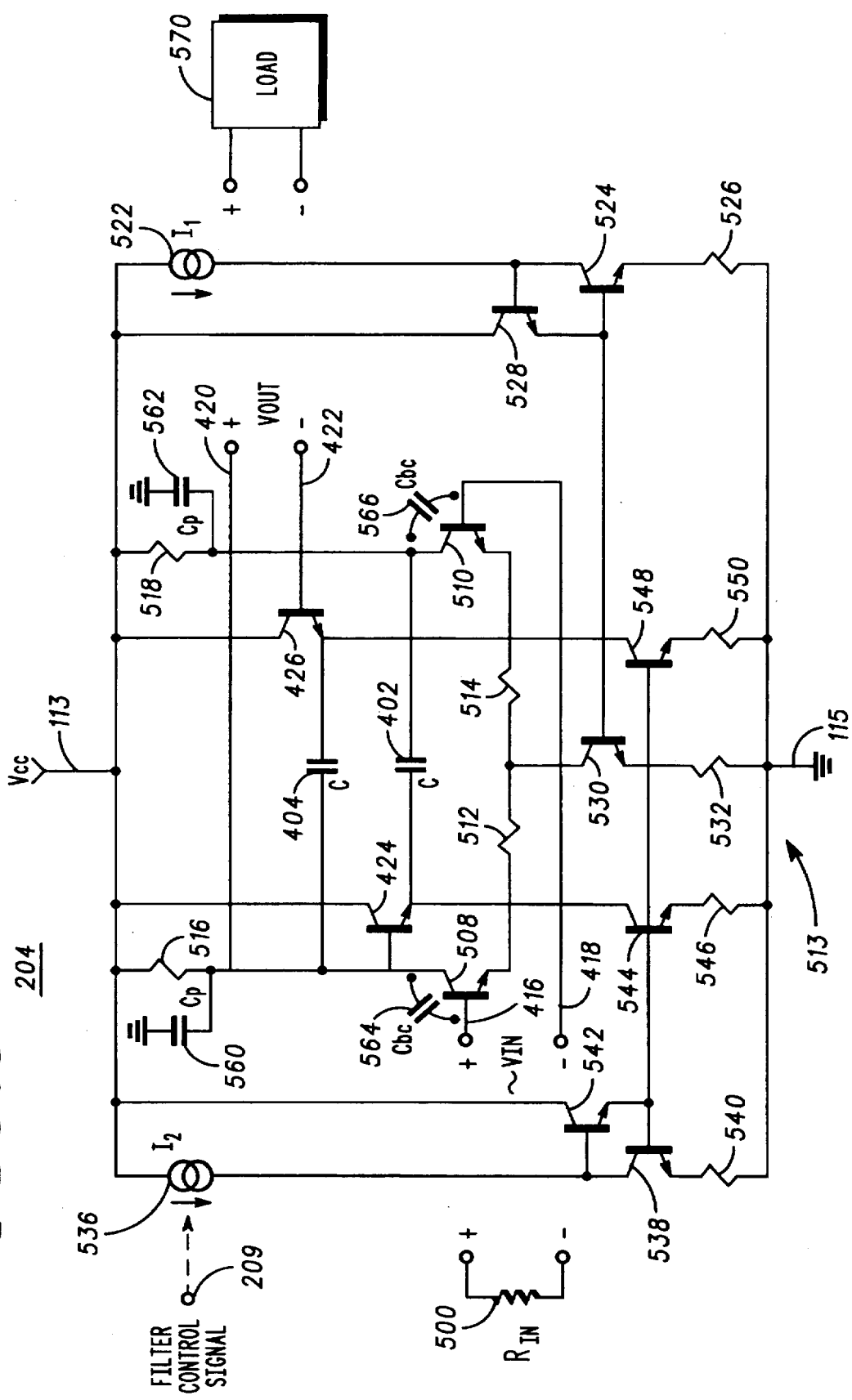
FIG. 5 is a more detailed schematic diagram of the amplifier circuit of FIG. 4.

FIG. 5 is a detailed schematic diagram of a preferred embodiment of amplifier circuit 204 of FIG. 4. Differential amplifier 400 of FIG. 4 is shown in FIG. 5 as comprising an npn transistor 508, an npn transistor 510, a resistive element 516, a resistive element 518, a resistive element 512, a resistive element 514, and a current source 513. Current source 513 includes a transistor 530, a resistive element 532, a transistor 524, a transistor 528, a resistive element 526, and a biasing current source 522 having a bias current $I_1$. Switch control circuit 410 of FIG. 4 is shown in FIG. 5 as comprising a main controllable current source 536 having a current $I_2$, a transistor 538, a resistive element 540, a transistor 542, a transistor 544, a resistive element 546, a transistor 548, and a resistive element 550. FIG. 5 also shows npn transistor 424, npn transistor 426, and capacitive elements 402, 404 each having a capacitance C.

The differential amplifier of FIG. 5 is coupled as follows. The input signal of amplifier circuit 204 is applied at input terminals 416, 418, corresponding to bases of npn transistors 508, 510. The output signal of amplifier circuit 204 is taken from output terminals 420, 422, corresponding to collectors of npn transistors 508, 510. The collector of npn transistor 508 is coupled to a first end of resistive element 516. Resistive element 516 has a second end which is coupled to reference voltage 113. The collector of npn transistor 510 is coupled to a first end of resistive element 518. Resistive element 518 has a second end which is coupled to reference voltage 113. An emitter of npn transistor 508 is coupled to a first end of resistive element 512, and an emitter of npn transistor 510 is coupled to a first end of resistive element 514. Second ends of resistive elements 512, 514 are coupled to current source 513 at a collector of transistor 530. Transistor 530 has an emitter coupled to a first end of resistive element 532. Resistive element 532 has a second end coupled to reference voltage 115. Transistor 530 has a base coupled to a base of transistor 524. Transistor 524 has an emitter coupled to a first end of resistive element 526.

Resistive element 526 has a second end coupled to reference voltage 115. Transistor collector collector coupled to a first end of biasing current source 522. Biasing current source 522 has a second end coupled to reference voltage 113. Transistor 528 has a base coupled to the collector of transistor 524, a collector coupled to reference voltage 113, and an emitter coupled to the base of transistor 524.

Capacitive elements 402, 404 and npn transistors 424, 426 are coupled to output terminals 420, 422 as follows. A base of npn transistor 424 is coupled to output terminal 420, and a base of npn transistor 426 is coupled to output terminal 422. Collectors of npn transistors 424, 426 are coupled to reference voltage 113. Capacitive element 404 has a first end coupled to output terminal 420 and a second end coupled to the emitter of npn transistor 426. Capacitive element 402 has a first end coupled to output terminal 422 and a second end coupled to the emitter of npn transistor 424.

The switch control circuit of FIG. 5 is coupled as follows. Main controllable current source 536 has a first end coupled to reference voltage 113 and a second end coupled to a collector of transistor 538. Transistor 538 has an emitter coupled to a first end of resistive element 540. Resistive element 540 has a second end coupled to reference voltage 115. Transistor 542 has a collector coupled to reference voltage 113, a base coupled to the collector of transistor 538, and an emitter coupled to a base of transistor 538. The base of transistor 538 is coupled to each base of transistors 544, 548. Transistor 544 has an emitter coupled to a first end of resistive element 546, and transistor 548 has an emitter coupled to a first end of resistive element 550. Resistive elements 546, 550 have second ends coupled to reference voltage 115. The switch control circuit of FIG. 5 is coupled to npn transistors 424, 426 as follows. A collector of transistor 544 is coupled to an emitter of npn transistor 424, and a collector of transistor 548 is coupled to an emitter of npn transistor 426.

A current mirror is formed by transistor 524 and transistor 530 whereby a tail current of the differential amplifier is set by biasing current source 522. The current mirror formed by transistors 524, 530 includes transistor 528 for base-current compensation. Another current mirror is formed by transistor 538, transistor 544, and transistor 548, whereby npn transistors 424, 426 may be switched on and off by main controllable current source 536. Main controllable current source 536 is controlled by filter control signal 209, and can be turned on or off. The current mirror formed by transistors 538, 544, 548 includes transistor 542 for base-current compensation.

For analytical purposes, FIG. 5 shows additional elements. The additional elements include an input resistive element 500, capacitive elements 560, 562, capacitive elements 564, 566, and a load 570. Input terminals 416, 418 are coupled to input resistive element 500 having a resistance $R_{in}$. Output terminals 420, 422 are coupled to load 570. Capacitive elements 560, 562 represent parasitic capacitances of elements at output terminals 420, 422, each having a capacitance $C_P$. Capacitive elements 564, 566 represent inherent base-to-collector capacitances of npn transistors 508, 510, each having a capacitance $C_{bc}$. A load impedance at output terminals 420, 422 can be expressed as:

$$Z_L = (2R_L) \| (2/j\omega C_p) \| ((\beta+1)/\beta)(r_e + 1/j\omega C),$$

where $$r_e = (kT/q)/I_2,$$

and where

ω is an operating frequency in radians;

$R_L$ is a resistance from a parallel combination of resistances of resistive elements 516, 518 and a real part of load 570;

β is a common-emitter current gain of npn transistors 424, 426;

$r_e$ is an emitter resistance of each of npn transistors 424, 426;

k is Boltzman's constant ($1.38 \times 10^{-23}$ joules/kelvin);

T is an absolute temperature in degrees kelvin; and q is the magnitude of an electron charge ($1.602 \times 10^{-19}$ coulomb).

Amplifier circuit 204 has a frequency response which is variable and controlled by $I_2$. When $I_2$ is off ($I_2 \approx 0$), $r_e$ is infinite and the frequency response of amplifier circuit 204 is limited substantially by the Miller capacitance associated with amplifier circuit 204. Assuming that a pole due to $C_{bc}$ is lower in frequency than a pole due to $C_p$, the frequency response of amplifier circuit 204 can be expressed as:

$$H(\omega) = G_0(1/(1+j\omega/\omega_c)),$$

where $$G_0 = -(g_m R_L)/(1 + R_E/r_\pi),$$

$$g_m = (\beta/(\beta+1))(I_1/2)/(kT/q),$$

$$r_\pi = \beta/g_m,$$

and where $G_0$ is a low frequency gain;

$\omega_c$ is a 3 dB cutoff frequency in radians;

$R_E$ is a resistance of each of resistive elements 512, 514;

$g_m$ is a transconductance of each of npn transistors 508, 510; and $r_\pi$ is a base-emitter resistance of each of npn transistors 508, 510.

If parasitic capacitances due to capacitive elements 402, 404 are small, $\omega_c$ is substantially determined by the Miller capacitance, and can be expressed as $$\omega_c = 1/(R_{in} C_{Miller}),$$

where $$C_{Miller} = C_{bc}(1-G_0),$$

and where $C_{Miller}$ represents the Miller capacitance.

When $I_2$ is on ($I_2 \gg (kT/q)(j\omega C)$), the frequency response of amplifier circuit 204 is limited by a pole created by a resistance of load 570 and C:

$$\omega_c = 1/(2R_L(2C_p + (\beta/(\beta+1))C)).$$

If C has a significant parasitic capacitance, a change in $\omega_c$ when $I_2$ is switched from off to on is directly proportional to a ratio of C to $C_p$. When $I_2$ is somewhere between off and on, that is, $0 > I_2 > (kT/q)(j\omega C)$, $r_e$ is significant and the frequency response cannot be approximated by a single-pole response.

FIG. 6 is a graph showing one possible variable frequency response of amplifier circuit 204. The graph of FIG. 6 was generated using computer simulations. When $I_2$ is off, amplifier circuit 204 has a frequency response corresponding to a response curve 600, where $C_{Miller}$ substantially determines the cutoff frequency. When $I_2$ is on, amplifier circuit 204 has a frequency response corresponding to a response curve 602, where C substantially determines the cutoff frequency. Computer simulations indicate that there is a small degradation in the maximum cutoff frequency attributed to parasitic capacitances of capacitive elements 402, 404. Still, however, changes in bandwidth of up to one decade are possible with a high-performance bipolar IC process. The graph of FIG. 6 shows a variable frequency response for an amplifier circuit designed for a 4-to-1 change in bandwidth with a maximum cutoff frequency of 2.4 Ghz. It is conceived that a number of amplifier stages may be combined with emitter-follower buffers to realize a multi-pole filter.

In addition, the cutoff frequency of amplifier circuit 204 varies linearly with tolerances associated with resistive elements 516, 518 and capacitive elements 402, 404. Therefore, if a design requires cutoff frequencies to be relatively close together, process variations may be significant. To account for such process variations, varactor diodes, not shown, may be placed at output terminals 420, 422.

In the preferred embodiment, amplifier circuit 204 and amplifier 206 of FIG. 2 are both designed in accordance with the present invention and manufactured in the same IC. In addition, amplifier circuit 204 and amplifier 206 are designed to operate at frequencies necessary for the generation of transmit frequencies for North American Digital Cellular (NADC) (824–849 Mhz) and Personal Digital Cellular (PDC) (940–960 Mhz) system applications. For the NADC system application, offset frequency generator 200 generates a signal having a nominal frequency of 90 Mhz, and local oscillator generator 202 generates a signal having a nominal frequency range of 914–939 Mhz. For the PDC system application, offset frequency generator 200 generates a signal having a nominal frequency of 220 Mhz, and local oscillator generator 202 generates a signal having a nominal frequency range of 720–740 Mhz. Accordingly, amplifier circuit 204 is configured to have a lower cutoff frequency in the NADC system application than the PDC system application, and amplifier 206 is configured to have a higher cutoff frequency in the NADC system application than the PDC system application. For example, in the above application, amplifier circuit 204 may have a first cutoff frequency $\omega_{c1}$ of approximately 300 Mhz and a second cutoff frequency $\omega_{c2}$ of approximately 100 Mhz.

The importance of variable filtering in such system applications is emphasized by the fact that the nominal frequency generated by offset frequency generator 200 during the PDC system application is over double that required in the NADC system application. A filter having a fixed cutoff frequency accommodating the nominal frequencies for both NADC and PDC system applications (e.g., a fixed filter having a cutoff frequency of about 300 Mhz) would undesirably allow harmonic signals of 90 Mhz to pass through during the NADC system application.

In summary, amplifier circuit 204 offers low-pass filter variability with a minimal number of active and passive devices. Amplifier circuit 204 has a signal path which includes only npn transistors and passive elements, thus enabling amplifier circuit 204 to operate at frequencies approaching the maximum operating frequency of npn transistors 508, 510. Amplifier circuit 204 has a cutoff frequency which is changed by changing a current through npn transistors 424, 426, transistors which are not active devices of the differential amplifier. Therefore, amplifier circuit 204 has a low frequency gain and intermodulation characteristics which remain substantially the same when the cutoff frequency is changed. In addition, npn transistors 424, 426 are not stacked on npn transistors 508, 510, thus enabling amplifier circuit 204 to operate at very low supply voltages.

While particular embodiments of the present invention have been shown and described, modifications may be made. For example, pnp transistors may be utilized in the switch control circuit and in the current source of the differential amplifier. It is therefore intended in the appended claims to cover all such changes and modifications which fall within the true spirit and scope of the invention.

What is claimed is:

1. An amplifier circuit having a variable bandwidth, said amplifier circuit comprising:
   an amplifier having an input terminal and an output terminal;
   a first npn transistor having a base, a collector, and an emitter, said base coupled to said output terminal, said collector coupled to a first reference voltage;
   a capacitive element having a first end, a second end, and a capacitance, said first end coupled to said emitter of said first npn transistor, said second end coupled to a second reference voltage; and
   a switch control circuit coupled to said emitter of said first npn transistor, said switch control circuit for switching on and off said first npn transistor.

2. The amplifier circuit of claim 1 wherein the amplifier circuit is manufactured in an integrated circuit.

3. The amplifier circuit of claim 1 wherein the amplifier further includes at least a second npn transistor for amplification.

4. The amplifier circuit of claim 3 wherein said amplifier circuit has a first frequency response having a first cutoff frequency and a second frequency response having a second cutoff frequency, wherein said at least a second npn transistor has a base-to-collector capacitance, and wherein said amplifier has a low frequency gain, said first cutoff frequency being substantially determined by said base-to-collector capacitance and said low frequency gain when said first npn transistor is switched off, said second cutoff frequency being substantially determined by said capacitance when said first npn transistor is switched on.

5. The amplifier circuit of claim 1 wherein said amplifier circuit has a first frequency response having a first cutoff frequency and a second frequency response having a second cutoff frequency, and wherein said amplifier has a maximum operating frequency, said first cutoff frequency being substantially determined by said maximum operating frequency when said first npn transistor is switched off, said second cutoff frequency being substantially determined by said capacitance when said first npn transistor is switched on.

6. An amplifier circuit comprising:
   a differential amplifier, said differential amplifier voltage-biased at a first reference voltage and a second reference voltage, said differential amplifier including a first input terminal, a second input terminal, a first output terminal, and a second output terminal;
   a first capacitive element having a first end and a second end, said first end coupled to said second output terminal;
   a second capacitive element having a first end and a second end, said first end coupled to said first output terminal;
   a first npn transistor having a base coupled to said first output terminal, a collector coupled to said first reference voltage, and an emitter coupled to said second end of said first capacitive element;
   a second npn transistor having a base coupled to said second output terminal, a collector coupled to said first reference voltage, and an emitter coupled to said second end of said second capacitive element; and a switch control circuit coupled to said emitters of said first and second npn transistors, said switch control circuit for switching on and off said first and said second npn transistors.

7. The amplifier circuit of claim 6 wherein the amplifier circuit is manufactured in an integrated circuit.

8. The amplifier circuit of claim 6 wherein the amplifier circuit has a variable frequency response including a first cutoff frequency and a second cutoff frequency, wherein said differential amplifier has a low frequency gain and includes at least a third and a fourth npn transistor for amplification, and wherein said at least third and fourth npn transistors have base-to-collector capacitances, said first cutoff frequency being established substantially by said low frequency gain and said base-to-collector capacitances when said first and second npn transistors are switched off, said second cutoff frequency being established substantially by capacitances of said first and second capacitive elements when said first and second npn transistors are switched on.

9. The amplifier circuit of claim 6 wherein the switch control circuit is responsive to a filter control signal and further includes a first controllable current source and a second controllable current source, said first controllable current source coupled to the emitter of said first npn transistor, said second controllable current source coupled to the emitter of said second npn transistor, said first and second controllable current sources turning on and off in response to said filter control signal.

10. An integrated circuit comprising:

a differential amplifier further including:

a first npn transistor and a second npn transistor, said first npn transistor having a base, collector, and an emitter, said second npn transistor having a base, collector, and an emitter, said base of said first npn transistor and said base of said second npn transistor providing an input to said amplifier circuit, said collector of said first npn transistor and said collector of said second npn transistor providing an output from said amplifier circuit;

a first resistive element having a first end and a second end, said first end coupled to said collector of said first npn transistor, said second end coupled to a first reference voltage;

a second resistive element having a first end and a second end, said first end coupled to a collector of said second npn transistor, said second end coupled to said first reference voltage;

a current source having a first end and a second end, said first end coupled to said emitter of said first npn transistor and said emitter of said second npn transistor, said second end coupled to a second reference voltage;

a first capacitive element having a first end, a second end, and a first capacitance, said first end of said first capacitive element coupled to said collector of said second npn transistor;

a second capacitive element having a first end, a second end, and a second capacitance, said first end of said second capacitive element coupled to said collector of said first npn transistor;

a third npn transistor having a base, a collector, and an emitter, said base coupled to said collector of said first npn transistor, said collector coupled to said first reference voltage, said emitter coupled to said second end of said first capacitive element;

a fourth npn transistor having a base, a collector, and an emitter, said base coupled to said collector of said second npn transistor, said collector coupled to said first reference voltage, said emitter coupled to said second end of said second capacitive element; and a switch control circuit including a first controllable current source and a second controllable current source, said first controllable current source having a first end coupled to said emitter of said third npn transistor and a second end coupled to said second reference voltage, said second controllable current source having a first end coupled to said emitter of said fourth npn transistor and a second end coupled to said second reference voltage, said first and said second controllable current sources for switching on and off said third and said fourth npn transistors.

11. The integrated circuit of claim 10 wherein said differential amplifier has a low frequency gain, and a variable frequency response including a first frequency response having a first cutoff frequency and a second frequency response having a second cutoff frequency, wherein said first npn transistor and said second npn transistor each have a base-to-collector capacitance, and wherein said first and second capacitive elements each have a capacitance, said first cutoff frequency being determined substantially by said low frequency gain and said base-to-collector capacitance when said third and fourth npn transistors are switched off, said second cutoff frequency being determined substantially by said capacitance when said third and fourth npn transistors are switched on.

12. A mobile station comprising:

a receiver;

a transmitter including an integrated circuit, said integrated circuit further including:

a differential amplifier, said differential amplifier voltage-biased at a first reference voltage and a second reference voltage, said differential amplifier having an input and an output, said output including a first output terminal and a second output terminal;

a first capacitive element having a first end and a second end, said first end coupled to said second output terminal;

a second capacitive element having a first end and a second end, said first end coupled to said first output terminal;

a first npn transistor having a base coupled to said first output terminal, a collector coupled to said first reference voltage, and an emitter coupled to said second end of said first capacitive element;

a second npn transistor having a base coupled to said second output terminal, a collector coupled to said first reference voltage, and an emitter coupled to said second end of said second capacitive element;

a switch control circuit coupled to said emitters of said first and second npn transistors, said switch control circuit for effectively coupling and decoupling said first and second capacitive elements from said first and second output terminals; and a controller coupled to said receiver and said transmitter, said controller providing a control signal to said switch control circuit for effectively coupling and decoupling said first and second capacitive elements.

* * * * *